(12) United States Patent
Chen et al.

(10) Patent No.: US 11,356,630 B2
(45) Date of Patent: Jun. 7, 2022

(54) IMAGE SENSOR WITH ANALOG BINNED READOUT OF IMAGE SENSING PHOTODIODES WITH PHASE DETECTION PHOTODIODES

(71) Applicant: OMNIVISION TECHNOLOGIES, INC., Santa Clara, CA (US)

(72) Inventors: Qingfei Chen, Santa Clara, CA (US); Chin Poh Pang, Pleasanton, CA (US); Qingwei Shan, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 241 days.

(21) Appl. No.: 16/855,854

(22) Filed: Apr. 22, 2020

(65) Prior Publication Data
US 2021/0337147 A1 Oct. 28, 2021

(51) Int. Cl.
*H04N 5/378* (2011.01)
*H04N 5/3745* (2011.01)
*H01L 27/146* (2006.01)

(52) U.S. Cl.
CPC ....... *H04N 5/378* (2013.01); *H01L 27/14612* (2013.01); *H01L 27/14641* (2013.01); *H01L 27/14645* (2013.01); *H04N 5/3745* (2013.01)

(58) Field of Classification Search
CPC .. H04N 5/36961; H04N 5/3559; H04N 5/378; H01L 27/14605; H01L 27/14612; H01L 27/14621; H01L 27/14641; H01L 27/14645
See application file for complete search history.

(56) References Cited

U.S. PATENT DOCUMENTS

2018/0294306 A1* 10/2018 Sambonsugi ..... H01L 27/14605
2019/0141255 A1* 5/2019 Hamano .............. H04N 5/2354

* cited by examiner

*Primary Examiner* — Tony Ko
(74) *Attorney, Agent, or Firm* — Perkins Coie LLP

(57) ABSTRACT

An imaging device includes a first pixel circuit having a first plurality of photodiodes that includes a phase detection autofocus photodiode with image sensing photodiodes. A first buffer transistor having a first threshold voltage is coupled to the first plurality of photodiodes to generate a first output signal. A second pixel circuit is included having a second plurality of photodiodes that are all image sensing photodiodes. A second buffer transistor having a second threshold voltage is coupled to the second plurality of photodiodes to generate a second output signal. The first threshold voltage is less than the second threshold voltage. A driver is coupled to receive a combination of the first and second output signals to generate a total output signal. An influence of the first output signal dominates the second output signal in the total output signal because the first threshold voltage is less than the second threshold voltage.

30 Claims, 5 Drawing Sheets

IMAGE SENSOR WITH ANALOG BINNED READOUT OF IMAGE SENSING PHOTODIODES WITH PHASE DETECTION PHOTODIODES

BACKGROUND INFORMATION

Field of the Disclosure

This disclosure relates generally to image sensors, and in particular but not exclusively, relates to image sensors that include phase detection autofocus pixels.

Background

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output signal from each photosensitive element that varies as a function of the incident image light. In other words, the amount of image charge generated is proportional to the intensity of the image light, which is utilized to produce a digital image (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
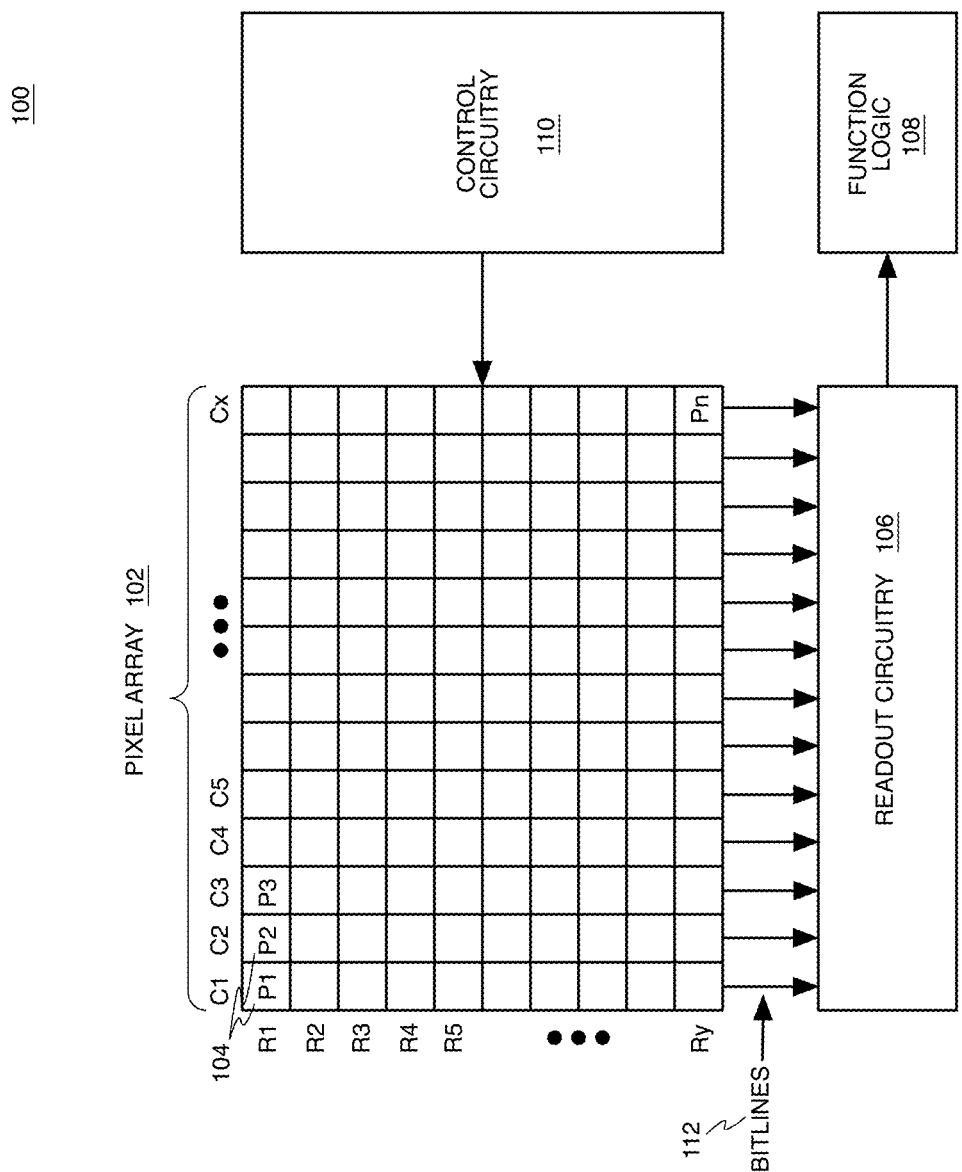
FIG. 1A illustrates one example of an imaging system including an image sensor with an analog binned readout of image sensing photodiodes with phase detection photodiodes in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to reading out analog binned photodiodes included in phase detection autofocus pixel circuits and image sensing pixel circuits in imaging systems are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of reading out analog binned phase detection autofocus pixel circuits and image sensing pixel circuits from color pixel arrays are disclosed. For instance, in one example an imaging device include phase detection autofocus pixel circuits interspersed among image sensing pixel circuits in a color pixel array. In the examples, each of the pixel circuits include a plurality of photodiodes, such as four photodiodes. It is noted that the examples described herein describe embodiments in which four photodiodes are included in each pixel circuit for explanation purposes. It is appreciated of course that in other examples, a fewer number or a greater number of photodiodes may be included in each pixel circuit. Assuming an example with four photodiodes per pixel circuit, the charge information generated from each of the four photodiodes in each pixel circuit is combined or binned together into one output signal. In various examples, the outputs of groupings of a plurality of pixel circuits are also combined together or analog binned and read out. In various examples, the groupings of the plurality of pixel circuits include a phase detection autofocus pixel and normal image sensing pixel circuits. In various examples, in order to read out the phase detection autofocus information from the analog binned pixel circuit outputs, the influence of the output of the phase detection autofocus pixel circuit is set to dominate the combined influence of the outputs of the normal image sensing pixel circuit by utilizing buffer amplifier or source follower transistors with low threshold voltages and/or utilizing floating diffusion boost signals in the phase detection autofocus pixel circuits in accordance with the teachings of the present invention.

To illustrate, FIG. 1A illustrates one example of an imaging system 100 including a color pixel array 102 from which analog binned pixel circuits including phase detection autofocus pixel circuits and normal image sensing pixel circuits are read out in accordance with an embodiment of the present disclosure. As will be discussed in greater detail below, phase detection information may be read out from the binned phase detection autofocus pixel circuits and image sensing pixel circuits with the utilization of buffer amplifiers with low threshold voltages and/or floating diffusion boost signals in the phase detection autofocus pixel circuits in accordance with the teachings of the present invention. As shown, imaging system 100 includes pixel array 102, control circuitry 110, readout circuitry 106, and function logic 108. In one example, pixel array 102 is a two-dimensional (2D) array including a plurality of photodiodes, (e.g., P1, P2, . . . Pn). In one example, some of the photodiodes that are interspersed among the array of photodiodes are configured as phase detection autofocus (PDAF) photodiodes, which are interspersed among regular image sensing photodiodes in the pixel array 102. As illustrated in the depicted example, pixel circuits 104 including PDAF photodiodes interspersed among image sensing photodiodes are arranged into rows (e.g., R1 to Ry) and columns (e.g., C1 to Cx) to acquire image data of a person, place, object, etc., which can then be used to render a 2D image of the person, place, object, etc. In the examples, the PDAF photodiodes that are interspersed in the in the pixel circuit 104 of pixel array 102 provide phase detection information, which can be utilized in autofocusing operations of imaging system 100.

In one example, after each image sensor photodiode in pixel array 102 has acquired its image charge or phase detection charge through the photogeneration of charge in response to incident light, the corresponding image charge data and/or phase detection charge data is read out by a readout circuitry 106 through bit lines 112 and then transferred to function logic 106 in accordance with teachings of the present invention. Readout circuitry 106 may be coupled to read out data from the pixel circuits 104 in pixel array 102. In various examples, the readout circuitry 106 may include amplification circuitry, analog-to-digital (ADC) conversion circuitry, or otherwise. In one example, the readout circuitry 106 may read out image data or phase detection data from pixels 104 through bit lines 112 as illustrated in FIG. 1A. The function logic 108 may store the image data or even manipulate the image data by applying post image effects (e.g., crop, rotate, remove red eye, adjust brightness, adjust contrast, or otherwise). In various examples, the phase detection autofocus information provided by the PDAF pixel circuits may be utilized by the imaging system 100 to provide autofocusing operations.

Figure 1B:
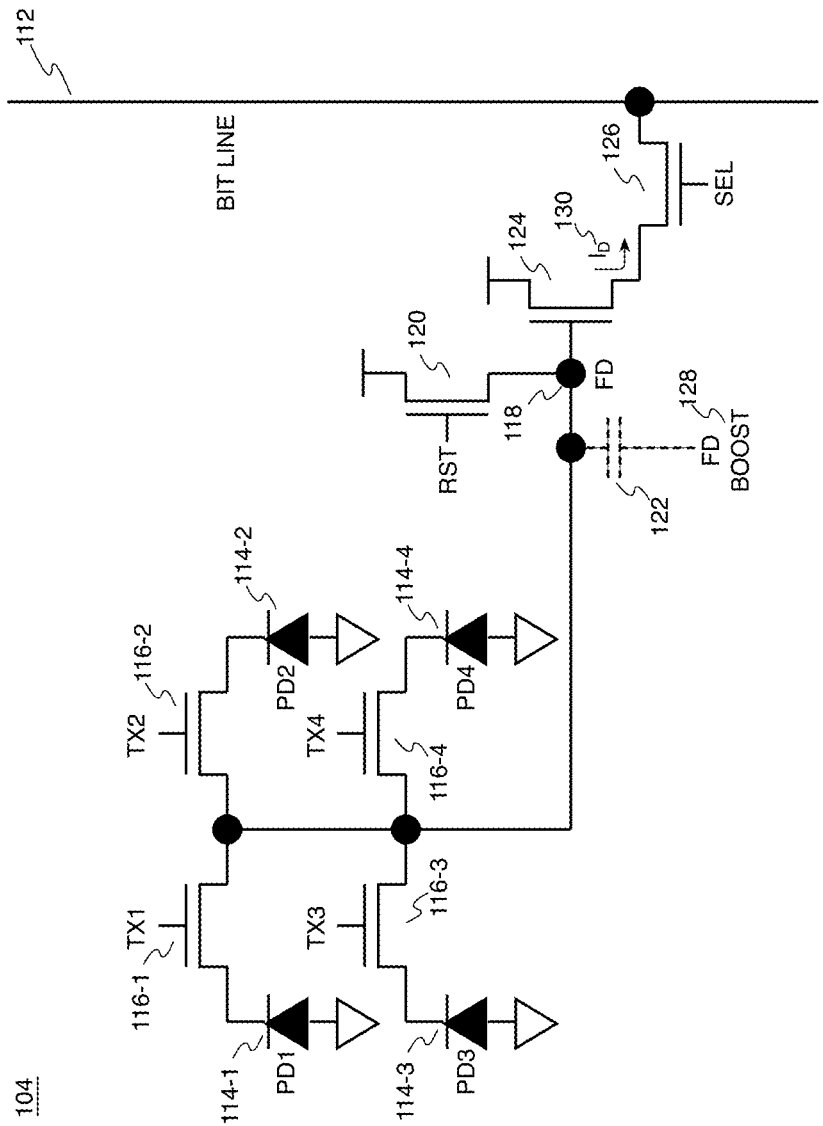
FIG. 1B illustrates one example of a pixel circuit with a grouping of photodiodes included in an imaging system including an image sensor with an analog binned readout of image sensing photodiodes with phase detection photodiodes in accordance with the teachings of the present invention.

FIG. 1B illustrates one example of a schematic of a pixel circuit 104, which is included in an image sensor from which phase detection autofocus information may be read out from analog binned phase detection autofocus pixel circuits and image sensing pixel circuits in accordance with the teachings of the present invention. It is appreciated the pixel circuit 104 of FIG. 1B may be one example of a pixel circuit 104 of the image sensor 100 as shown in FIG. 1A, and that similarly named and numbered elements described above are coupled and function similarly below.

In the example depicted in FIG. 1B, pixel circuit 104 is one of a plurality of pixel circuits 104 included in a pixel array 102. Pixel circuit 104 includes a grouping of a plurality of photodiodes, which in the depicted example is four neighboring photodiodes 114-1, 114-2, 114-3, and 114-4. Each photodiode 114-1, 114-2, 114-3, and 114-4 is coupled to photogenerate charge in response to incident light 128. As will be discussed, some or all of the photodiodes 114 in pixel circuit 104 may be configured as image sensing photodiodes onto which incident light is directed through color lenses of a color filter array. In some instances, some or at least one of the photodiodes 114 may be configured as a phase detection autofocus photodiode onto which incident light may be directed through a phase detection autofocus lens.

In an example in which all of the photodiodes 114 in pixel circuit 104 are configured as image sensing photodiodes, pixel circuit 104 may be considered an image sensing pixel circuit 104. In an example in which some or at least one of the photodiodes 114 in pixel circuit 104 are configured as image sensing photodiodes, pixel circuit 104 may be considered phase detection autofocus pixel circuit 104. It is noted that the examples described herein describe for explanation purposes embodiments in which the phase detection autofocus pixel circuits 104 include two photodiodes that are configured as phase detection autofocus photodiodes and two photodiodes that are configured as image sensing photodiodes. It is appreciated of course that in other examples, a fewer number or a greater number of phase detection autofocus photodiodes may be included among image sensing photodiodes.

The example depicted in FIG. 1B also illustrates that a grouping of transfer transistors is coupled between a floating diffusion 118 and the grouping of photodiodes. In the example, the grouping of transfer transistors includes transfer transistors 116-1, 116-2, 116-3, and 116-4, which are coupled to be controlled in response to transfer transistor control signals TX1, TX2, TX3, and TX4, respectively. As such, floating diffusion 118 is coupled to receive the photogenerated charge from the four photodiodes 114-1, 114-2, 114-3, and 114-4 through the transfer transistors 116-1, 116-2, 116-3, and 116-4. The photogenerated charge received from the four photodiodes 114-1, 114-2, 114-3, and 114-4 is therefore combined together or analog binned in floating diffusion 118.

The example shown in FIG. 1B shows that a reset transistor 120 and a buffer transistor 124 are coupled to a voltage supply and to floating diffusion 118. In operation, the reset transistor is coupled to reset the floating diffusion 118 in response to a reset signal RST. In the example, the buffer transistor 124 has a gate terminal that is coupled to the floating diffusion 118 to generate an output signal 130 in response to the photogenerated charge that has been transferred to floating diffusion 118 from the photodiodes 114 through the respective transfer transistors 116. In one example, the buffer transistor 124 is a buffer amplifier or a source follower coupled MOSFET transistor that is coupled to provide output signal 130, which includes a drain current $I_D$ as shown. In the depicted example, a select transistor 126 is coupled between the buffer transistor 124 and a bit line 112. In operation, the output signal 130 is output by pixel circuit 104 to bit line 112 through the select transistor 126 in response to a select signal SEL. As will be discussed in greater detail below, in various embodiments, bit line 112 is coupled to receive a plurality of output signals 130 from plurality of pixel circuits 104 at the same time. As such, each output signal 130 received by bit line 112 is combined or analog binned with other output signals 130 when the respective pixel circuits 104 are read out in accordance with the teachings of the present invention.

Figure 2:
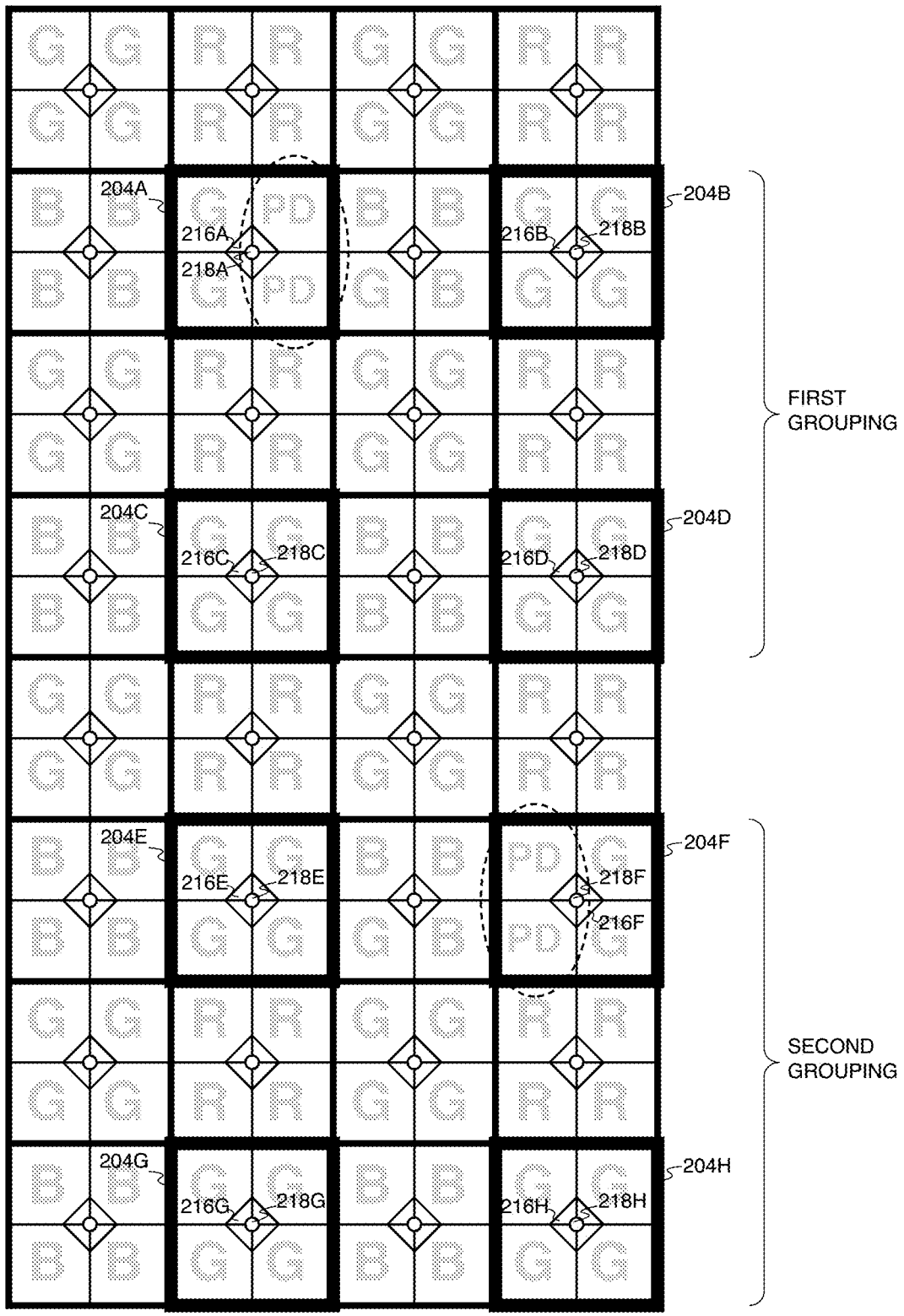
FIG. 2 illustrates a one example of a color pixel array with an array of photodiodes including phase detection autofocus photodiodes interspersed among image sensing photodiodes in accordance with the teachings of the present disclosure.

FIG. 2 illustrates an example of a color pixel array 202 including a color filter array disposed over pixel circuits, which include pixel circuits 204A, 204B, 204C, 204D, 204E, 204F, 204G, and 204H as shown in accordance with the teachings of the present invention. It is appreciated the color pixel array 202 of FIG. 2 may be an example of pixel array 102 as discussed in FIG. 1A and that the pixel circuits 204A, 204B, 204C, 204D, 204E, 204F, 204G, and 204H may be examples of pixel circuit 104 as discussed in FIG. 1B, and that similarly named and numbered elements described above are coupled and function similarly below.

In the example depicted in FIG. 2, pixel circuits 204A, 204B, 204C, 204D, 204E, 204F, 204G, and 204H are organized into groupings of four pixel circuits. The first grouping of pixel circuits includes pixel circuits 204A, 204B, 204C, and 204D. The second groping of pixel circuits includes pixel circuits 204E, 204F, 204G, and 204H. In various examples, all of the pixel circuits in each grouping of pixel circuits is read out at the same time. Within each pixel circuit 204 is a respective grouping of four neighboring photodiodes surrounding four respective transfer transistors 216A, 216B, 216C, 216D, 216E, 216F, 216G, and 216H, which surround respective floating diffusions 218A, 218B, 218C, 218D, 218E, 218F, 218G, and 218H. Thus, as shown in the depicted example, each individual floating diffusion 218A, 218B, 218C, 218D, 218E, 218F, 218G, and 218H is shared among the four respective photodiodes included in each respective pixel circuit 204A, 204B, 204C, 204D, 204E, 204F, 204G, and 204H through respective transfer transistors 216A, 216B, 216C, 216D, 216E, 216F, 216G, and 216H.

In the example, a color filter array having a Bayer color filter array pattern is disposed over the pixel circuits 204 of the color pixel array 202. In the depicted example, the color filter array includes a plurality of color filters. In the depicted example, the color filters of the color filter array include red color filters that are indicated with a "R" label, green color filters that are indicated with a "G" label, and blue color filters that are indicated with a "B" label. In the depicted example, each color filter is disposed over a respective photodiode of the underlying pixel circuit 204. As shown in the example depicted in FIG. 2, all of the photodiodes of each pixel circuit 204A, 204B, 204C, 204D, 204E, 204F, 204G, and 204H that are under a color filter are under a color filter having the same green "G" color. As such, all of photodiodes of pixel circuits 204A, 204B, 204C, 204D, 204E, 204F, 204G, and 204H that are illuminated under a color filter are illuminated with green "G" incident light.

The example depicted in FIG. 2 also illustrates that each grouping of pixel circuits includes a pixel circuit that includes one or more PDAF photodiodes. In particular, the first grouping of pixel circuits pixel circuits 204A, 204B, 204C, and 204D includes a pixel circuit 204A that includes two PDAF photodiodes inside the dashed oval line, which are labeled "PD." The remaining pixel circuits 204B, 204C, and 204D of the first grouping include all normal image sensing photodiodes that are optically coupled to receive green "G" incident light. Similarly, the second grouping of pixel circuits pixel circuits 204E, 204F, 204G, and 204H includes a pixel circuit 204F that includes two PDAF photodiodes inside the dashed oval line, which are labeled "PD." The remaining pixel circuits 204E, 204G, and 204H of the second grouping include all normal image sensing photodiodes that are optically coupled to receive green "G" light.

In the various examples, the pixel circuits that include PDAF photodiodes may be considered PDAF pixel circuits that provide phase detection information and the other pixel circuits that include all image sensing photodiodes are normal image sensing pixel circuits. As will be discussed, an imaging system including color pixel array 202 may read out an entire grouping of a plurality of pixel circuits at a time, which in the example includes four pixel circuits or 16 photodiodes at a time with analog binning or combining the output signals from each pixel circuit in accordance with the present invention. In the various examples, the phase detection information that is included in the total output signal from the four pixel circuits or 16 photodiodes in the grouping is read out by having the influence of output signal from the PDAF pixel circuit dominate the influence of the output signal from the normal image sensing pixel circuits in the combined or analog binned total output signal from the grouping of pixel circuits in accordance with teachings of the present invention.

Figure 3:
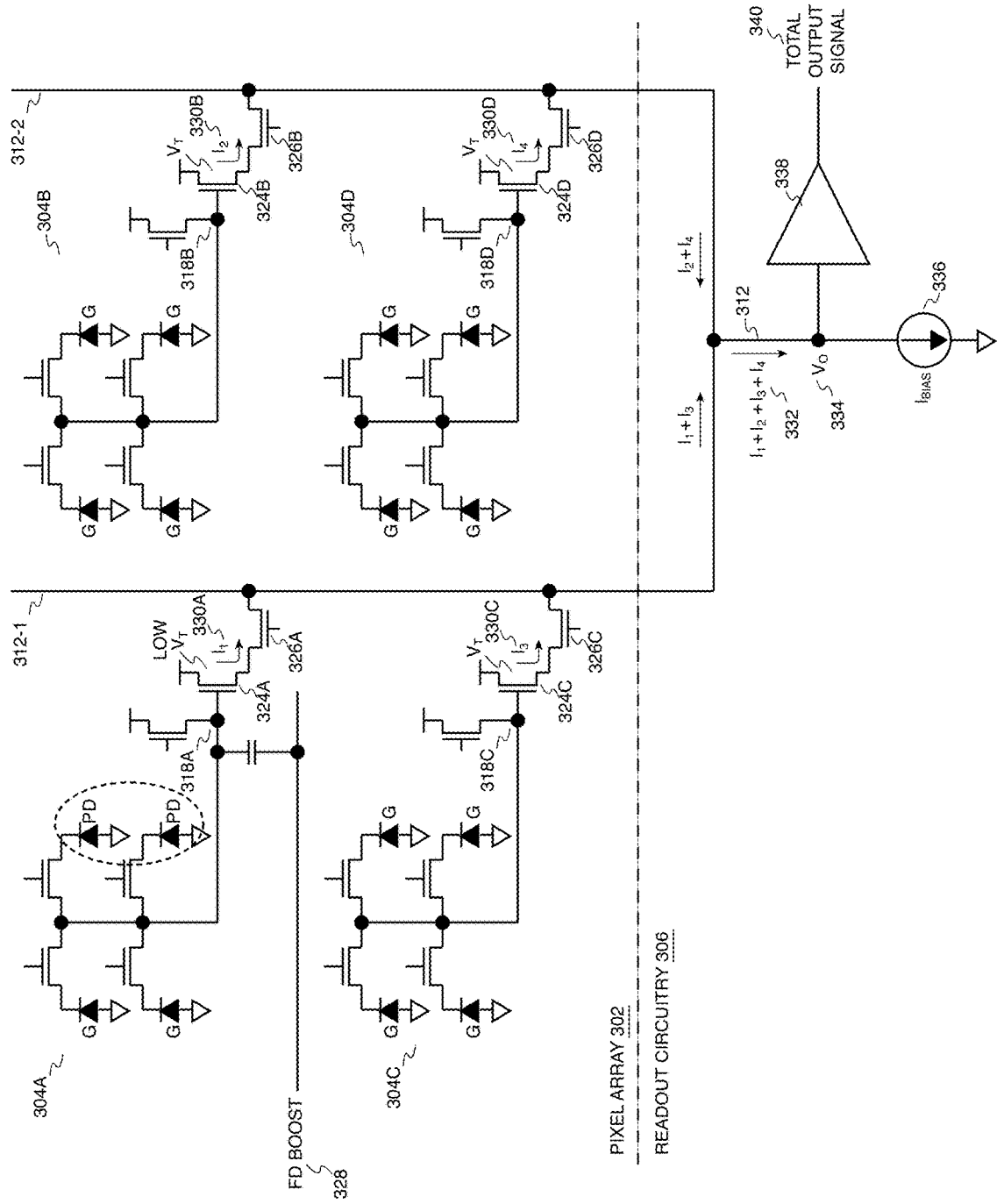
FIG. 3 shows one example of a schematic of color pixel array with a grouping of pixel circuits including phase detection autofocus pixel circuits interspersed among image sensing pixel circuits that are analog binned and read out with readout circuitry in an image sensor in accordance with the teachings of the present invention.

To illustrate, FIG. 3 shows one example of a schematic of a color pixel array 302 including a grouping of pixel circuits with a PDAF pixel circuit 304A interspersed among normal image sensing pixel circuits 304B, 340C, and 304D that are analog binned and read out with readout circuitry 306 in an image sensor in accordance with the teachings of the present invention. It is appreciated the color pixel array 302 and readout circuitry 306 of FIG. 3 may be an example of pixel array 102 and readout circuitry 106 as discussed in FIG. 1A, and that the pixel circuits 304A, 304B, 304C, and 304D of FIG. 3 may be examples of the first grouping of pixel circuits 204A, 204B, 204C, and 204D as discussed in FIG. 2, or of pixel circuit 104 as discussed in FIG. 1B, and that similarly named and numbered elements described above are coupled and function similarly below.

As shown in the example of FIG. 3, pixel array 302 includes a grouping of pixel circuits including a PDAF pixel circuit 304A and normal image sensing pixel circuits 304B, 304C, and 304D. As shown, each pixel circuit 304 includes a plurality of photodiodes. PDAF pixel circuit 304A includes two PDAF photodiodes, as indicated with "PD" labels inside the dashed oval line, and two image sensing photodiodes that are optically coupled to receive green "G" incident light, as indicated with the "G" labels. In operation, the two PDAF photodiodes are configured to provide phase detection information (along with other PDAF pixel circuits in the pixel array 302 that are read out separately). The normal image sensing pixel circuits 304B, 304C, and 304D each include four image sensing photodiodes that are optically coupled to receive green "G" incident light, as indicated with the "G" labels. In operation, the normal image sensing photodiodes are configured to provide image sensing information. Each pixel circuit 304 includes a respective floating diffusion 318 that is coupled to receive the charge photogenerated from each respective photodiode through a respective transfer transistor. As such, the photogenerated charge from the four photodiodes is combined or analog binned in each respective floating diffusion 318.

The depicted example shows that each pixel circuit 304 includes a respective buffer transistor 324 that is coupled to a respective floating diffusion 318 in the pixel circuit 304. In various examples, each buffer transistor 324 is a buffer amplifier or source follower coupled MOSFET having a gate terminal that is coupled to the respective floating diffusion 318 to generate a respective output signal 330. In the various examples, the output signals 330 from each buffer transistor 324 includes a current. Therefore, the output signal 330A from PDAF pixel circuit 304A is also labeled $I_1$, the output signal 330B from image sensing pixel circuit 304C is also labeled $I_3$, the output signal 330B from image sensing pixel circuit 304B is also labeled $I_2$, and the output signal 330D from image sensing pixel circuit 304D is also labeled $I_4$.

Each output signal 330 from each respective pixel circuit 304 is coupled to be received by bit line 312 through a respective select transistor 326 as shown. In the example depicted in FIG. 3, the readout circuitry 306 is coupled to receive the output signals 330 from the pixel circuits 304 of pixel array 302 through bit line 312. The depicted example shows that bit line 312 is split into a first portion 312-1 and a second portion 312-2. Bit line portion 312-1 is coupled to receive output signal 330A current $I_1$ from PDAF pixel circuit 304A and output signal 330C current $I_3$ from image sensing pixel circuit 304C. Bit line portion 312-2 is coupled to receive output signal 330B current $I_2$ from image sensing pixel circuit 304B and output signal 330D current $I_4$ from image sensing pixel circuit 304D.

As such, the output signal 330A and 330C currents I1 and I3 are combined together or analog binned as $I_1+I_3$ in bit line portion 312-1 as shown. Similarly, the output signal 330B and 330D currents $I_2$ and $I_4$ are combined together or analog binned as $I_2+I_4$ in bit line portion 312-2 as shown. The bit line portions 312-1 and 312-2 are merged together in readout circuitry 306. As such, the $I_1+I_3$ and $I_2+I_4$ current components of the output signals 330A, 330B, 330C, and 330D are combined together or analog binned again as $I_1+I_2+I_3+I_4$ in bit line 312 as shown. Bit line 312 is coupled to a current source 336, which is coupled to ground and to an input of a driver 338 in readout circuitry 306 as shown. Current source 336 is coupled to receive the analog binned currents as $I_1+I_2+I_3+I_4$ and sink a bias current $I_{BIAS}$ as shown. The voltage $V_O$ developed from bit line 312 at current source 336 is coupled to be received at an input to driver 338, which used to generate a total output signal 340 that is representative of the readout of charge information from the grouping of pixel circuits 304A, 304B, 340C, and 304D. Therefore, in the various examples, the total output signal 340 is representative of the analog binned charge that is read out from the respective four pixel cells 304 or the respective 16 photodiodes in accordance with the teachings of the present invention.

The example schematic illustrated in FIG. 3 can also be applied to read out other groupings of pixel cells as illustrated for example in FIG. 2, and the plurality bit lines included in the imaging system, as illustrated for example in FIG. 1A, can be utilized to read multiple columns of groupings of pixel cells in accordance with the teachings of the present invention.

Referring back to the example depicted in FIG. 3, it is noted that buffer transistor 324A of the PDAF pixel circuit 304A has a low threshold voltage "low $V_T$" compared to the higher threshold voltage "$V_T$" of the buffer transistors 324B, 324C, and 324D of the normal image sensing pixel circuits 304B, 304C, and 304D in accordance with the teachings of the present invention. With the lower threshold voltage "low $V_T$" of the buffer transistor 324A, the influence of the output signal 330A current $I_1$ will dominate over the influence of the remaining output signal currents $I_2+I_3+I_4$ in accordance with teachings of the present invention.

In addition, in one embodiment, a floating diffusion boost signal 328 may also be applied to the floating diffusion 318A of the PDAF pixel 304 to further boost the influence of the output signal 330A current $I_1$ over the influence of the combination of the remaining output signal currents $I_2+I_3+I_4$ during readouts of the charge information from the grouping of pixel circuits 304A, 304B, 304C, and 304D in accordance with teachings of the present invention. In this example, the floating diffusions 318B, 318C, and 318D of the normal image sensing pixels pixel 304B, 304C, and 304D are unboosted and therefore do not receive the floating diffusion boost signal 328 during read outs. Thus, the phase detection information from PDAF pixel 304A included in the $I_1+I_2+I_3+I_4$ current in bit line 312 will not be lost due to the analog binning of the output signals 330A, 330B, 330C, and 330D in accordance with teachings of the present invention.

To illustrate, in the various examples, each buffer transistor 324 in each pixel circuit 304 is a source follower coupled MOSFET. As such, the drain current $I_D$ through the buffer transistor 324 in saturation can be characterized with Equation (1) as follows:

$$I_D(sat) = \frac{\mu \cdot C_{ox}}{2} \cdot \frac{w}{L} \cdot (V_{GS} - V_{TH})^2, \qquad (1)$$

where $I_D$(sat) represents the drain current of the buffer transistor 324 in saturation, μ represents a constant surface mobility of all mobile electrons in the inversion layer of the buffer transistors 324, Cox represents the gate oxide capacitance of the buffer transistor 324 per unit area, W represents the channel width of the buffer transistor 324, L represents the channel length of the buffer transistor 324, $V_{GS}$ represents the gate-source voltage of the buffer transistor 324, and $V_{TH}$ represents the threshold voltage of the buffer transistor 324.

If we assume that the voltage at the respective floating diffusion is $V_{FD}^{PD}$ at the gate terminal of the buffer transistor 324A and that the voltage drop across the select transistor 326A is minimal, the gate-source voltage of the buffer transistor 324A can be substituted with $V_{FD}^{PD}-V_O$. As such, the output signal 330A drain current $I_1$ of the buffer transistor 324A of the PDAF pixel circuit 304A can be characterized with Equation (2) as follows:

$$I_1 = \frac{w}{2L} \cdot \mu \cdot C_{ox} \cdot (V_{FD}^{PD} - V_O - V_{TH}^{PD})^2, \quad (2)$$

where $V_{TH}^{PD}$ represents the low threshold voltage $V_T$ of the buffer transistor 324A.

Similarly, if we assume that the voltage at the respective floating diffusions 318B, 318C, and 318D at the respective gate terminals of the buffer transistors 324B, 324C, and 324D is $V_{FD}^{i}$ (with i=2, 3, 4) and that the voltage drops across the respective select transistors 326B, 326C, and 326D are minimal, then the combined output signal drain current $I_2$, $I_3$, and $I_4$ of the buffer transistors 324B, 324C, and 324D of the normal image sensing pixel circuits 304B, 304C, and 304D can be characterized with Equation (3) as follows:

$$I_2 + I_3 + I_4 = \sum_{i=2}^{4} \frac{w}{2L} \cdot \mu \cdot C_{ox} \cdot (V_{FD}^i - V_O - V_{TH}^i)^2, \quad (3)$$

where $V_{TH}^{i}$ (with i=2, 3, 4) represents the higher threshold voltage $V_T$ of the buffer transistors 324B, 324C, and 324D, respectively.

Therefore, combining Equations (2) and (3) above, the bias current $I_{BIAS}$ of current source 336, which is also equal to $I_1 + I_2 + I_3 + I_4$, can be characterized with Equation (4) as follows:

$$I_{BIAS} = \frac{w}{2L} \cdot \mu \cdot C_{ox} \cdot (V_{FD}^{PD} - V_O - V_{TH}^{PD})^2 + \quad (4)$$
$$\sum_{i=2}^{4} \frac{w}{2L} \cdot \mu \cdot C_{ox} \cdot (V_{FD}^i - V_O - V_{TH}^i)^2.$$

Since the lower threshold voltage $V_{TH}^{PD}$ of the buffer transistor 324A is less than the higher threshold voltage $V_{TH}^{i}$ (with i=2, 3, 4) of buffer transistors 324B, 324C, and 324D, the influence of the $I_1$ component (i.e., Equation (2)) of $I_1+I_2+I_3+I_4$ dominates the bias current $I_{BIAS}$.

Furthermore, in the various examples, the influence of the $I_1$ (i.e., Equation (2)) component of $I_1+I_2+I_3+I_4$ can be further boosted by applying or activating the floating diffusion boost signal 328 to floating diffusion 318A of PDAF pixel circuit 304A as shown in FIG. 3. In the examples, the floating diffusions 318B, 318C, and 318D of normal image pixels 304B, 304C, and 304D are unboosted. With the application of floating diffusion boost signal 328 to floating diffusion 318A, the floating diffusion voltage $V_{FD}^{PD}$ at the gate terminal of buffer transistor 324A will be boosted to be greater than the floating diffusion voltages $V_{FD}^{i}$ (with i=2, 3, 4) at the respective gate terminals of buffer transistors 324B, 324C, and 324D. Therefore, Equation (4) shows that the influence of the $I_1$ component (i.e., Equation (2)) of $I_1+I_2+I_3+I_4$ will even further dominate the bias current $I_{BIAS}$ in accordance with the teachings of the present invention.

As a result, the output signal 330A current $I_1$ will dominate over the influence of the remaining output signal currents $I_2+I_3+I_4$ and will take the vast majority of the bias current $I_{BIAS}$ so that the voltage $V_O$ that is received by driver 338 will only substantially follow the voltage $V_{FD}^{PD}$ the floating diffusion 318A of the PDAF pixel circuit 304A in accordance with the teachings of the present invention.

Figure 4:
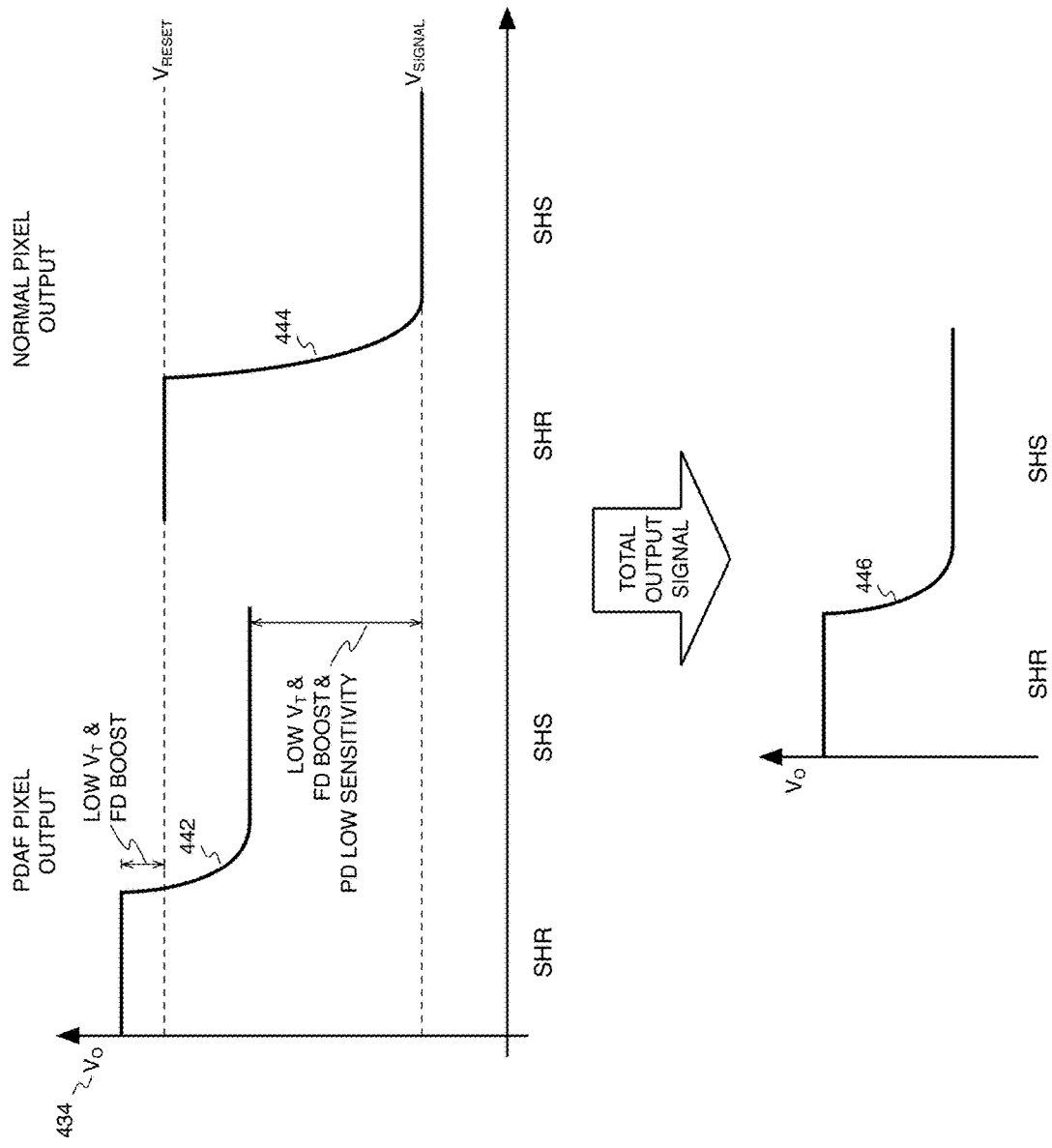
FIG. 4 shows example of timing diagrams illustrating the relative relationships between a phase detection autofocus readout, a normal image sensing readout, and a total combined readout of analog binned pixel circuits accordance with the teachings of the present invention.

To illustrate, FIG. 4 shows example of timing diagrams illustrating the relative relationship between the PDAF pixel circuit readout, normal image sensing pixel circuit readout, and total combined readouts of the analog binned pixel circuits accordance with the teachings of the present invention. It is appreciated the example timing diagrams shown in FIG. 4 illustrate example output signal readings of color pixel array 302 and readout circuitry 306 of FIG. 3, which may be included in an example of pixel array 102 and readout circuitry 106 of in FIG. 1A, and include examples of the first grouping of pixel circuits 204A, 204B, 204C, and 204D as discussed in FIG. 2, or of pixel circuit 104 as discussed in FIG. 1B. As such, similarly named and numbered elements described above are coupled and function similarly below.

The timing diagram example illustrated in FIG. 4 shows an example of the voltage $V_O$ 434, which may be an example of the voltage $V_O$ 334 at the input of driver 338 of FIG. 3. The examples illustrate the $V_O$ 434 readout voltage during correlated double sampling (CDS) of the PDAF pixel circuit output reading 442 in the upper left portion of FIG. 4, the $V_O$ 434 readout voltage during correlated double sampling of the normal image sensing pixel circuit output reading 444 in the upper right portion of FIG. 4, and the combined total output signal 446 of the PDAF pixel circuit and the normal image sensing pixel circuit output in the bottom portion of FIG. 4.

As shown in the readout 442 illustrated in the upper left portion of FIG. 4, the sample and hold reading of a reset (SHR) value for the $V_O$ voltage 434 of a PDAF pixel circuit output is greater than the SHR value $V_{RESET}$ of a normal image sensing pixel circuit output shown in the readout 444 illustrated in the upper right portion of FIG. 4. This greater reading of the $V_O$ voltage 434 of the PDAF pixel circuit output readout 442 is due to the low threshold voltage $V_T$ as well as the floating diffusion boost signal applied to the floating diffusion of the PDAF pixel circuit discussed previously.

In addition, FIG. 4 shows that the sample and hold reading of a signal (SHS) value for the $V_O$ voltage 434 of a PDAF pixel circuit output reading 442 is also greater than the SHS value $V_{SIGNAL}$ of a normal image sensing pixel circuit output reading 444. This greater reading of the $V_O$ voltage 434 of the PDAF pixel circuit output 442 is due to the low threshold voltage $V_T$, the application of the floating diffusion boost signal to the floating diffusion of the PDAF pixel circuit discussed previously, as well as PDAF photodiodes having lower sensitivity than normal image sensing photodiodes in general.

As a result, the combined total output signal 446 of the PDAF pixel circuit and the normal image sensing pixel circuit outputs for four pixel circuits or 16 photodiodes shown in the bottom portion of FIG. 4 is dominated by the influence of the PDAF pixel circuit output reading 442. The dominance of the influence of the PDAF pixel circuit output over the normal image sensing pixel circuit output is due to the low threshold voltage $V_T$ of the buffer transistor included in the PDAF pixel circuit compared to the higher threshold voltage $V_T$ of the buffer transistors included in the normal pixel circuits, as well as the floating diffusion boost signal applied to the floating diffusion of the PDAF pixel circuit in accordance with the teachings of the present invention. In operation, it is appreciated that the PDAF pixel circuit output signal can therefore be selected and read out after the combined outputs or analog binned outputs of the four pixel circuits or 16 photodiodes at both the SHR and SHS points of a correlated double sampling in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging device, comprising:
    a first pixel circuit, including:
        a first plurality of photodiodes, wherein the first plurality of photodiodes includes at least one phase detection autofocus (PDAF) photodiode, wherein remaining photodiodes in the first plurality of photodiodes are all image sensing photodiodes; and
        a first buffer transistor having a first threshold voltage, wherein the first buffer transistor is coupled to the first plurality of photodiodes to generate a first output signal in response to charge photogenerated by the first plurality of photodiodes in response to incident light;
    a second pixel circuit, including:
        a second plurality of photodiodes, wherein the second plurality of photodiodes are all image sensing photodiodes; and
        a second buffer transistor having a second threshold voltage, wherein the first threshold voltage is less than the second threshold voltage, wherein the second buffer transistor is coupled to the second plurality of photodiodes to generate a second output signal in response to charge photogenerated by the second plurality of photodiodes in response to the incident light; and
    a driver coupled to receive the first and second output signals to generate a total output signal in response to a combination of the first and second output signals, wherein an influence of the first output signal dominates an influence of the second output signal in the total output signal in response to the first threshold voltage being less than the second threshold voltage.

2. The imaging device of claim 1, wherein the at least one PDAF photodiode has a lower sensitivity to the incident light than the image sensing photodiodes.

3. The imaging device of claim 1,
    wherein first pixel circuit further comprises a first floating diffusion coupled between the first plurality of photodiodes and the first buffer transistor to receive the charge photogenerated by the first plurality of photodiodes, wherein the first floating diffusion is coupled to receive a floating diffusion boost signal during a read out of the at least one PDAF photodiode, and
    wherein second pixel circuit further comprises a second floating diffusion coupled between the second pixel circuit of the first plurality of photodiodes and the second buffer transistor to receive the charge photogenerated by the second plurality of photodiodes, wherein the second floating diffusion unboosted during the read out of the at least one PDAF photodiode.

4. The imaging device of claim 3,
    wherein the first buffer transistor is coupled to first floating diffusion generate the first output signal in response to the first floating diffusion analog binning the charge photogenerated by the first plurality of photodiodes, and
    wherein the second buffer transistor is coupled to second floating diffusion generate the second output signal in response to the second floating diffusion analog binning the charge photogenerated by the second plurality of photodiodes.

5. The imaging device of claim 3,
    wherein first pixel circuit further comprises a plurality of first transfer transistors coupled between the first plurality of photodiodes and the first floating diffusion, wherein the first floating diffusion is coupled to receive the charge photogenerated by the first plurality of photodiodes through the first plurality of transfer transistors, and
    wherein second pixel circuit further comprises a plurality of second transfer transistors coupled between the second plurality of photodiodes and the second floating diffusion, wherein the second floating diffusion is coupled to receive the charge photogenerated by the second plurality of photodiodes through the second plurality of transfer transistors.

6. The imaging device of claim 3, further comprising a bit line coupled to receive the first output signal from the first pixel circuit and the second output signal from the second pixel circuit, wherein the bit line is coupled to provide a combination of the first and second output signals to the driver circuit.

7. The imaging device of claim 6, wherein the second pixel circuit is one of a plurality of second pixel circuits, wherein each one of the plurality of second pixel circuits is coupled to generate a respective second output signal of a plurality of second output signals coupled to be received by the bit line, wherein the bit line is coupled to provide a combination of the first output signal and the plurality of second output signals to the driver circuit.

8. The imaging device of claim 7, wherein the bit line is coupled to provide the combination of the first output signal and the plurality of second output signals to the driver circuit by analog binning the first output signal and the plurality of second output signals.

9. The imaging device of claim 7, wherein the first pixel circuit, the plurality of second pixel circuits, and the bit line are included in a pixel array.

10. The imaging device of claim 9, further comprising a color filter array including a plurality of color filters disposed over the pixel array, wherein the first pixel circuit and the plurality of second pixel circuits are disposed under respective color filters having a same color.

11. The imaging device of claim 9, wherein the plurality of second pixel circuits includes three second pixel circuits, wherein each one of the three second pixel circuits is coupled to generate a respective second output signal of three second output signals coupled to be received by the bit line, wherein the bit line is coupled to provide a combination of the first output signal and the three second output signals to the driver circuit.

12. The imaging device of claim 9, wherein the first pixel circuit and the plurality of second pixel circuits are one of a plurality of groupings pixel circuits coupled to the bit line, wherein the bit line is configured to read out one of each of the plurality of groupings at a time.

13. The imaging device of claim 12, wherein the bit line is one of a plurality of bit lines, wherein each one of the plurality of bit lines is coupled to a respective plurality of groupings of pixel circuits.

14. The imaging device of claim 1,
wherein the first plurality of photodiodes is arranged in a first 2×2 grouping of four neighboring photodiodes including two PDAF photodiodes and two image sensing photodiodes, and
wherein the second plurality of photodiodes is arranged in a second 2×2 grouping of four neighboring photodiodes including four image sensing photodiodes.

15. The imaging device of claim 1, wherein the first and second buffer transistors comprise source follower coupled transistors.

16. An imaging system, comprising:
a pixel array coupled to generate image data in response to incident light, the pixel array including:
a first pixel circuit, including:
a first plurality of photodiodes, wherein the first plurality of photodiodes includes at least one phase detection autofocus (PDAF) photodiode, wherein remaining photodiodes in the first plurality of photodiodes are all image sensing photodiodes; and
a first buffer transistor having a first threshold voltage, wherein the first buffer transistor is coupled to the first plurality of photodiodes to generate a first output signal in response to charge photogenerated by the first plurality of photodiodes in response to the incident light;
a second pixel circuit, including:
a second plurality of photodiodes, wherein the second plurality of photodiodes are all image sensing photodiodes; and
a second buffer transistor having a second threshold voltage, wherein the first threshold voltage is less than the second threshold voltage, wherein the second buffer transistor is coupled to the second plurality of photodiodes to generate a second output signal in response to charge photogenerated by the second plurality of photodiodes in response to the incident light; and
a control circuitry coupled to the pixel array to control operation of the pixel array; and
a readout circuitry coupled to the pixel array to read out the first and second output signals from the pixel array, wherein the readout circuitry includes a driver coupled to receive the first and second output signals to generate a total output signal in response to a combination of the first and second output signals, wherein an influence of the first output signal dominates an influence of the second output signal in the total output signal in response to the first threshold voltage being less than the second threshold voltage, wherein the image data is generated in response to the total output signal.

17. The imaging system of claim 16, further comprising function logic coupled to the readout circuitry to store the image data read out from the pixel array.

18. The imaging system of claim 16, wherein the at least one PDAF photodiode has a lower sensitivity to the incident light than the image sensing photodiodes.

19. The imaging system of claim 16,
wherein first pixel circuit further comprises a first floating diffusion coupled between the first plurality of photodiodes and the first buffer transistor to receive the charge photogenerated by the first plurality of photodiodes, wherein the first floating diffusion is coupled to receive a floating diffusion boost signal during a read out of the at least one PDAF photodiode, and
wherein second pixel circuit further comprises a second floating diffusion coupled between the second pixel circuit of the first plurality of photodiodes and the second buffer transistor to receive the charge photogenerated by the second plurality of photodiodes, wherein the second floating diffusion unboosted during the read out of the at least one PDAF photodiode.

20. The imaging system of claim 19,
wherein the first buffer transistor is coupled to first floating diffusion generate the first output signal in response to the first floating diffusion analog binning the charge photogenerated by the first plurality of photodiodes, and
wherein the second buffer transistor is coupled to second floating diffusion generate the second output signal in response to the second floating diffusion analog binning the charge photogenerated by the second plurality of photodiodes.

21. The imaging system of claim 19,
wherein first pixel circuit further comprises a plurality of first transfer transistors coupled between the first plurality of photodiodes and the first floating diffusion, wherein the first floating diffusion is coupled to receive the charge photogenerated by the first plurality of photodiodes through the first plurality of transfer transistors, and
wherein second pixel circuit further comprises a plurality of second transfer transistors coupled between the second plurality of photodiodes and the second floating diffusion, wherein the second floating diffusion is coupled to receive the charge photogenerated by the second plurality of photodiodes through the second plurality of transfer transistors.

22. The imaging system of claim 19, wherein the pixel array further comprises a bit line coupled to receive the first output signal from the first pixel circuit and the second output signal from the second pixel circuit, wherein the bit line is coupled to the readout circuitry to provide a combination of the first and second output signals to the driver circuit.

23. The imaging system of claim 22, wherein the second pixel circuit is one of a plurality of second pixel circuits included in the pixel array, wherein each one of the plurality of second pixel circuits is coupled to generate a respective second output signal of a plurality of second output signals coupled to be received by the bit line, wherein the bit line is coupled to provide a combination of the first output signal and the plurality of second output signals to the driver circuit.

24. The imaging system of claim 23, wherein the bit line is coupled to provide the combination of the first output signal and the plurality of second output signals to the driver circuit by analog binning the first output signal and the plurality of second output signals.

25. The imaging system of claim 23, further comprising a color filter array including a plurality of color filters disposed over the pixel array, wherein the first pixel circuit and the plurality of second pixel circuits are disposed under respective color filters having a same color.

26. The imaging system of claim 23, wherein the plurality of second pixel circuits includes three second pixel circuits, wherein each one of the three second pixel circuits is coupled to generate a respective second output signal of three second output signals coupled to be received by the bit line, wherein the bit line is coupled to provide a combination of the first output signal and the three second output signals to the driver circuit.

27. The imaging system of claim 23, wherein the first pixel circuit and the plurality of second pixel circuits are one of a plurality of groupings pixel circuits coupled to the bit line, wherein the bit line is configured to read out one of each of the plurality of groupings at a time.

28. The imaging system of claim 27, wherein the bit line is one of a plurality of bit lines, wherein each one of the plurality of bit lines is coupled to a respective plurality of groupings of pixel circuits.

29. The imaging system of claim 16,
wherein the first plurality of photodiodes is arranged in a first 2×2 grouping of four neighboring photodiodes including two PDAF photodiodes and two image sensing photodiodes, and
wherein the second plurality of photodiodes is arranged in a second 2×2 grouping of four neighboring photodiodes including four image sensing photodiodes.

30. The imaging system of claim 16, wherein the first and second buffer transistors comprise source follower coupled transistors.

* * * * *